United States Patent
Rolandi et al.

(10) Patent No.: US 9,287,284 B2
(45) Date of Patent: Mar. 15, 2016

(54) SEMICONDUCTOR FIELD-EFFECT TRANSISTOR, MEMORY CELL AND MEMORY DEVICE

(71) Applicant: Micron Technology, Inc., Boise, ID (US)

(72) Inventors: Paolo Rolandi, Voghera (IT); Cristiano Calligaro, Torre D'lsola (IT); Luigi Pascucci, Sesto San Giovanni (IT)

(73) Assignee: Micron Technology, Inc., Boise, ID (US)

( * ) Notice: Subject to any disclaimer, the term of this patent is extended or adjusted under 35 U.S.C. 154(b) by 11 days.

(21) Appl. No.: 14/311,061

(22) Filed: Jun. 20, 2014

(65) Prior Publication Data

US 2014/0302649 A1   Oct. 9, 2014

Related U.S. Application Data

(62) Division of application No. 12/293,534, filed as application No. PCT/IT2006/000170 on Mar. 20, 2006, now Pat. No. 8,759,915.

(51) Int. Cl.
| | |
|---|---|
| *H01L 27/115* | (2006.01) |
| *H01L 21/822* | (2006.01) |
| *H01L 27/06* | (2006.01) |
| *H01L 27/12* | (2006.01) |
| *H01L 29/78* | (2006.01) |
| *H01L 27/105* | (2006.01) |

(52) U.S. Cl.
CPC ...... *H01L 27/11551* (2013.01); *H01L 21/8221* (2013.01); *H01L 27/0688* (2013.01); *H01L 27/1052* (2013.01); *H01L 27/115* (2013.01); *H01L 27/1203* (2013.01); *H01L 29/7832* (2013.01)

(58) Field of Classification Search
CPC combination set(s) only.
See application file for complete search history.

(56) References Cited

U.S. PATENT DOCUMENTS

| | | | |
|---|---|---|---|
| 6,034,882 | A | 3/2000 | Johnson et al. |
| 6,501,111 | B1 | 12/2002 | Lowrey |
| 6,940,109 | B2 | 9/2005 | Patel et al. |
| 2002/0192911 | A1 | 12/2002 | Parke |
| 2004/0124466 | A1 | 7/2004 | Walker et al. |
| 2004/0206996 | A1 | 10/2004 | Lee |
| 2005/0001218 | A1 | 1/2005 | Hackler et al. |

FOREIGN PATENT DOCUMENTS

| | | |
|---|---|---|
| CN | 1367937 | 9/2002 |
| EP | 057452375 | 5/2011 |
| JP | 2001-077364 | 3/2001 |
| JP | 2004-517466 | 6/2004 |
| WO | WO 02/15277 | 2/2002 |
| WO | WO 02/19396 | 3/2002 |
| WO | WO 2004/061863 | 7/2004 |
| WO | PCT/IT2006/000170 | 9/2006 |
| WO | PCT/IT2006/000170 | 1/2007 |

OTHER PUBLICATIONS

Sun et al.; "The Junction MOS (JMOS) Transistorn—A High Speed Transistor for VLSI", IEEE International Electron Devices Meeting, vol. 26, 1980, United States, pp. 791-794 (XP001290769).

*Primary Examiner* — Matthew Reames
(74) *Attorney, Agent, or Firm* — Wells St. John P.S.

(57) ABSTRACT

Semiconductor device formed by a first conductive strip of semiconductor material; a control gate region of semiconductor material, facing a channel portion of the first conductive strip, and an insulation region arranged between the first conductive strip and the control gate region. The first conductive strip includes a conduction line having a first conductivity type and a control line having a second conductivity type, arranged adjacent and in electrical contact with each other, and the conduction line forms the channel portion, a first conduction portion and a second conduction portion arranged on opposite sides of the channel portion.

12 Claims, 8 Drawing Sheets

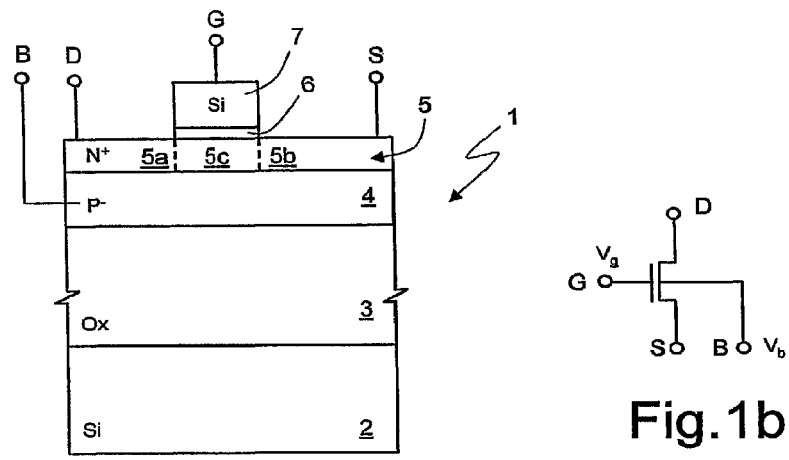
Fig.1a
Fig.1b
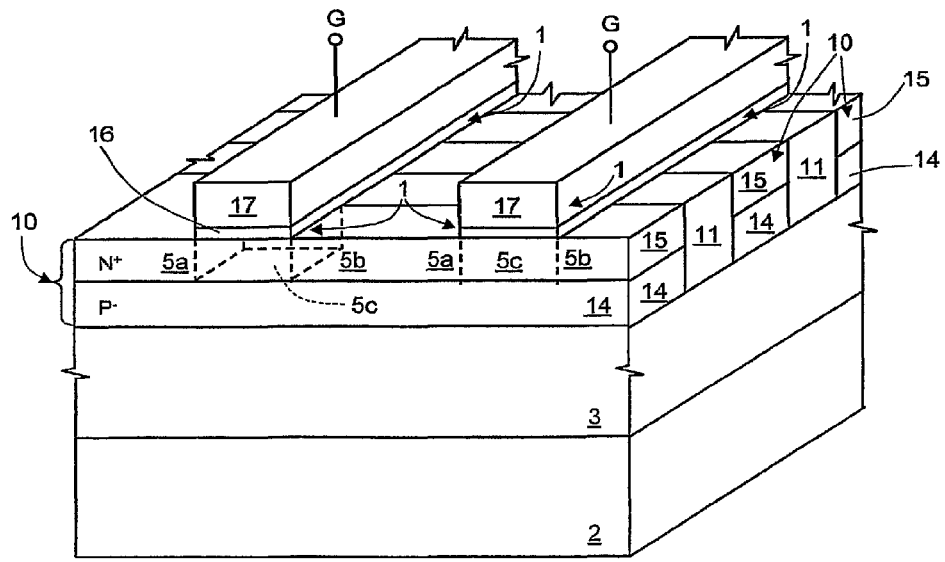
Fig.2

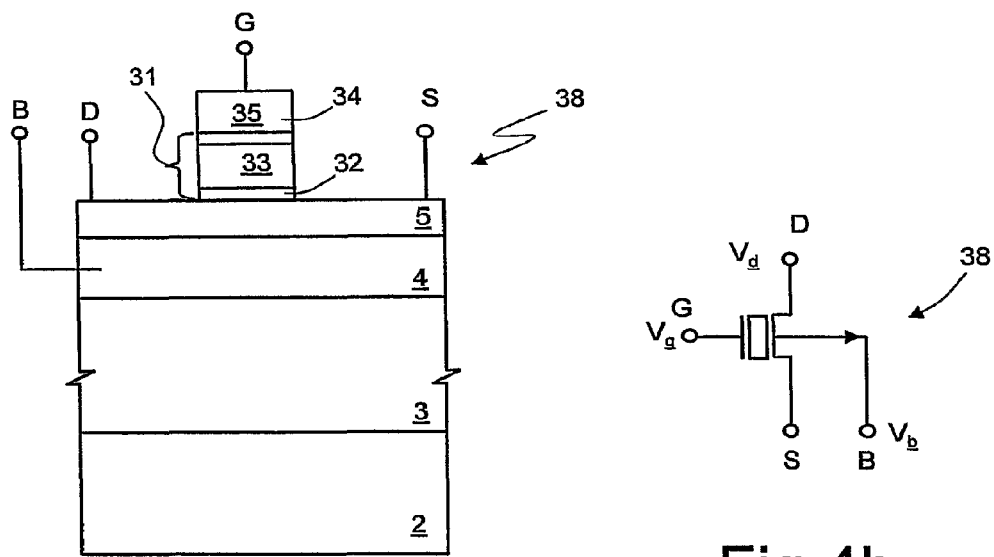
Fig.4a
Fig.4b
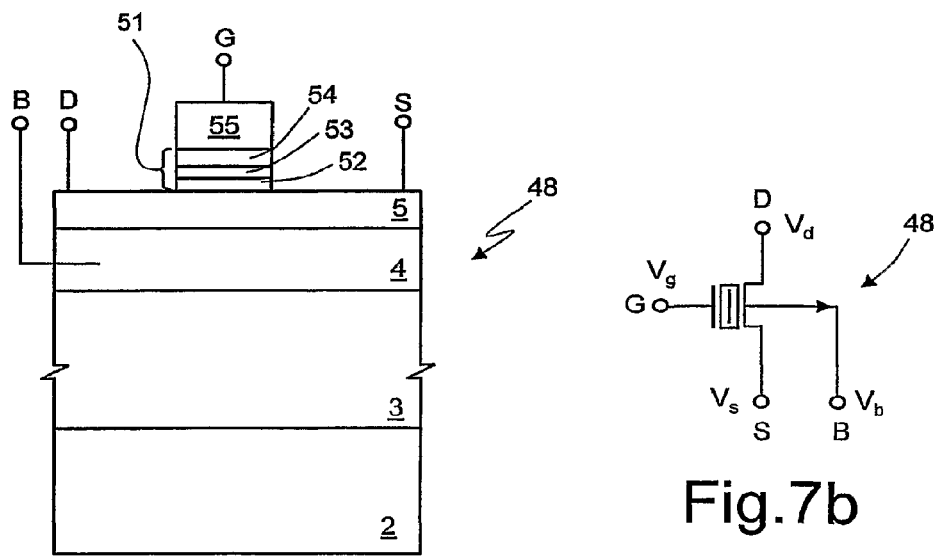
Fig.7a
Fig.7b

SEMICONDUCTOR FIELD-EFFECT TRANSISTOR, MEMORY CELL AND MEMORY DEVICE

RELATED PATENT DATA

The present application is a divisional of and claims priority to U.S. patent application Ser. No. 12/293,534, which was filed Dec. 23, 2009, which is a national phase entry of and claims priority under 35 U.S.C. §120 to International Patent Application No. PCT/IT2006/000170, which was filed Mar. 20, 2006, the disclosures of which are incorporated herein by reference.

TECHNICAL FIELD

The present invention regards a field-effect electronic device, forming a transistor, a memory cell, and a device array.

BACKGROUND

As is known, the market requires mass storage memories that are able to store an ever increasing amount of data. Consequently, for some time research has been aimed at reducing the dimensions of individual cells so as to enable integration of an ever increasing number of cells in a single device. Another known solution consists in trying to store an increasing number of bits in a single cell, using multilevel storage techniques (the so-called "electrical enhancement").

Both the solutions have, however, limitations linked both to theoretical limits and to difficulties in the design of memory arrays and of circuits designed to enable input and output of data into/from the memory arrays.

Other known solutions envisage the development of cells in a direction orthogonal to the traditionally used plane, comprising rows and columns. In particular, three-dimensional memory arrays have already been proposed, formed by superimposed levels of cells and thus provided also with a third dimension.

In this connection, U.S. Pat. No. 6,034,882 discloses a three-dimensional array wherein the memory cells are arranged on different levels and are formed by a selection element in series to a phase change element. The selection element is formed, for example, by a PN diode, a Schottky diode, a Zener diode, an SCR, a bipolar transistor or a field-effect transistor. The phase change element is formed, for example, by a fuse of dielectric material or of amorphous or polycrystalline silicon, by a ferroelectric capacitor, or by a Hall effect device. The memory array is thus formed by a grid of one-time programmable cells (OTP devices). This device is consequently unsuited to mass storage applications, wherein it is necessary to be able to erase and rewrite the cells a number of times.

U.S. Pat. No. 6,501,111 further describes a three-dimensional memory array that can be electrically programmed using as elementary cell a phase change resistance based upon the use of calcogenides. This solution thus uses a technology different from the classic ones employed for manufacturing electronic memories, which calls for the use of particular materials that are not common in the semiconductor industry and thus presents costs and levels of reliability that are still not well known.

Finally, U.S. Pat. No. 6,940,109 B2 describes a three-dimensional structure formed by transistors or memory cells and comprising a number of levels, each formed by a plurality of parallel lines extending each perpendicular to the lines of the level underneath it and the level above it. In the case of a memory array, each line is formed by a stack of layers, basically comprising: a bottom dielectric layer housing channel regions, each of which faces and is in electrical contact at its ends with two lines of the underlying level; a series of intermediate charge storage layers; and a series of top conductive layers in electrical contact with the channel regions of an overlying level. The two adjacent lines of an underlying level in electrical contact with a channel region of an overlying level thus constitute source and drain regions of a memory cell, while the top conductive layers of the overlying level form the gate of the same cell. In addition, the top conductive layers that form the gate of a cell of a given level form also the source and drain regions of cells of an overlying level.

In this way, each memory cell is formed so that it bestrides two levels and comprises at least three lines: two bottom, source and drain, lines and a top, gate, line.

Consequently, even though the structure enables a considerable increase in the density of cells per unit area, it does not efficiently exploit the available layers. In addition, the practical difficulties in alignment of the various layers, in particular of the ends of the channel regions to the bottom, source and drain, lines, causes actual manufacturing to be very difficult, require high production tolerances that partly nullify the gain in space achieved, and in practice cause the array difficult to produce.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

FIG. 1a is a cross-section of a body of semiconductor material, showing the structure of a transistor according to an embodiment of the present invention.

FIG. 1b illustrates the equivalent electrical circuit of the transistor of FIG. 1a.

FIG. 2 shows a perspective view of a planar array formed by transistors according to FIG. 1a.

FIG. 3 shows a perspective view of a three-dimensional multitransistor structure formed by the transistors of FIG. 1a.

FIG. 4a is a cross-section of a body of semiconductor material, showing the structure of a memory cell according to an embodiment of the present invention.

FIG. 4b illustrates the equivalent electrical circuit of the memory cell of FIG. 4a.

FIG. 5 is a perspective view of a planar memory array formed by memory cells according to FIG. 4a.

FIG. 7*a* is a cross-section of a body of semiconductor material, showing the structure of a memory cell according to an embodiment of the present invention.

FIG. 7*b* represents the equivalent electrical circuit of the memory cell of FIG. 7*a*.

DETAILED DESCRIPTION OF EXAMPLE EMBODIMENTS OF THE INVENTION

Figure 3:
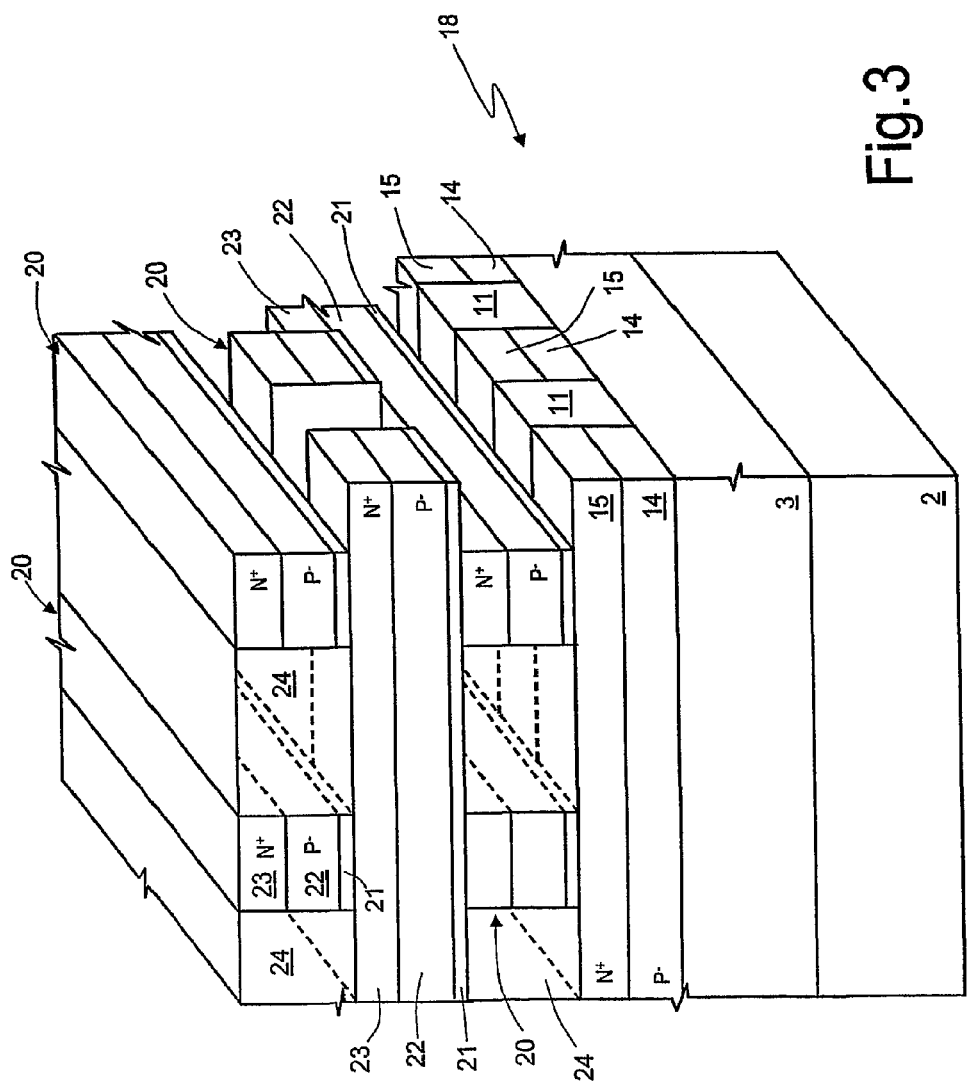

FIG. 1*a* shows the structure of a transistor 1 according to a first aspect of the invention.

The transistor 1 is formed in a body of semiconductor material 2 comprising a stack formed by a silicon substrate 2; a thick oxide layer 3; a bulk region 4; a conduction region 5; a gate oxide region 6; and a gate region 7. The bulk region 4 is preferably of polycrystalline silicon of a P-type, with a thickness of, for example, 70 nm, and the conduction region 5 is preferably of polycrystalline silicon of an N+ type, with a thickness of, for example, 50 nm. The bulk region 4 and conduction region 5 form a first conductive strip 10. The gate region 7 is formed by a second conductive strip 17, as shown in the perspective view of FIG. 2, which regards an array of transistors. The gate oxide region 6 has a structure and thickness similar to the ones currently used in standard CMOS processes, and the gate region 7 is of polycrystalline silicon, with an N+ or P doping, as in standard MOS devices.

The conduction region 5 is connected, on a first side of the gate region 7 (on the left in the drawing), to a drain terminal D, where it forms a first conduction region 5*a*, and, on a second side of the gate region 7 (on the right in the drawing), to a source terminal S, where it forms a second conduction region 5*b*. The portion of the conduction region 5 underneath the gate region 7 and between the first and second conduction regions 5*a*, 5*b* forms a channel region 5*c*. As may be noted, the bulk region 4 extends in a continuous way underneath the conduction regions 5*a*, 5*b* and the channel region 5*c*.

The bulk region 4 is connected to a bulk terminal B, and the gate region 7 is connected to a gate terminal G.

The equivalent electrical circuit of the transistor 1 of FIG. 1*a* is shown in FIG. 1*b*, where also the voltages Vb, Vg, Vd and Vs applied, respectively, to the bulk terminal B, gate terminal G, drain terminal D and source terminal S are shown.

The transistor 1 is of a "depletion" type, in which, in the absence of voltage on the gate terminal and with the bulk region grounded, the threshold voltage Vth0 is negative, with a value correlated to the doping level of N type and to the thickness of the conduction region 5 (for example, with the thickness indicated, the doping can be adjusted so that Vth0 =−1.5V). In this condition, the conduction region 5 operates as a current conductor and enables the passage of current between the drain terminal D and the source terminal S. Instead, application to the drain terminal D of a negative voltage with a value below the threshold voltage causes depletion of the channel region 5*c* and thus its pinch-off. In this condition, the transistor 1 is off.

The threshold voltage of the transistor 1 can be modified by applying a voltage with a negative value, referred to hereinafter as bulk voltage Vb, to the bulk region 4 via the body terminal B. In this condition, in fact, on account of the body effect, the threshold voltage Vth of the transistor 1 becomes:

$$Vth=Vth0+f(Vb),$$

where f(Vb) is a (known) function of the bulk voltage Vb and is of a positive value. In particular, in the absence of voltage on the gate terminal G, if $$|Vth0|>|f(Vb)|$$

the threshold voltage Vth is negative; if, instead, $$|Vth0|<|f(Vb)|$$

the threshold voltage Vth is positive.

In the latter case, the transistor 1 is normally off (with Vg=0V) and turns on only when the gate voltage Vg exceeds the threshold voltage Vth, analogously to standard enhancement transistors.

In this way, the transistor 1 has two different control regions, namely, the gate region 7 and the bulk region 4, which can be used either alternatively or in combination to obtain pinch-off of the channel region 5*c*.

The transistor 1 of FIG. 1 *a* can be manufactured simply by building the stack of layers 2-4, for example depositing the thick oxide layer 3, a first polycrystalline silicon layer of P type on top of the substrate 2, so as to form the bulk region 4, and then a second polycrystalline silicon layer of N type, so as to form the conduction region 5; next, in a standard way, the gate oxide region 6 and the gate region 7 are formed.

FIG. 2 shows an array 12 of planar transistors formed using the transistor 1 of FIG. 1*a*. As may be noted, a plurality of strips 10 extend on top of the thick oxide layer 3, each strip 10 being formed by a bulk line 14 and a conduction line 15, laterally insulated from one another by insulation regions 11, of dielectric material. A plurality of gate oxide lines 16 and a plurality of gate lines 17 extend on top of the strips 10 and of the insulation regions 11, in a direction perpendicular to the strips 10.

In the array 12 of FIG. 2, each strip 10 forms a plurality of channel portions 5*c*, each facing a respective gate line 17 and a plurality of first and second conduction portions 5*a*, 5*b* arranged on opposite sides of each channel portion. In practice, each strip 10 forms a plurality of transistors 1, cascaded-connected to one another and aligned in the direction of the strip 10. In addition, each gate line 17 forms, in the direction of the gate lines 17, a plurality of mutually insulated transistors 1.

In the array 12 of FIG. 2, analogously to what described with reference to FIG. 1*a*, in the absence of biasing of the bulk line 14 (Vb=0V), all the transistors along a same strip 10 are on. If, instead, a bulk voltage Vb is applied to the bulk line 14, all the transistors on the strip 10 are off. Consequently, the conductivity of the individual transistors 1 of the array of FIG. 2 can be modulated by applying appropriate bulk voltages to the bulk lines 14 and to the gate lines 17 of the array 12. For example, the transistor can be biased with Vb=1.5-2 V, and is found in an on or off condition according to the gate voltage Vg.

The manufacturing process is similar to the one discussed above, but for the fact of requiring arrangement of the insulation regions 11 between the strips 10. The insulation regions can be, for example, oxide regions formed, prior to the implantation for forming the regions 14 and 15, by digging trenches and filling them with dielectric material.

FIG. 3 shows a three-dimensional transistor array 18 formed by a plurality of planes or levels, each having the structure shown in FIG. 2, wherein the gate regions of each level are formed by strips 20 having the same structure as the strips 10 of FIG. 2, as explained in detail hereinafter.

Figure 3A:
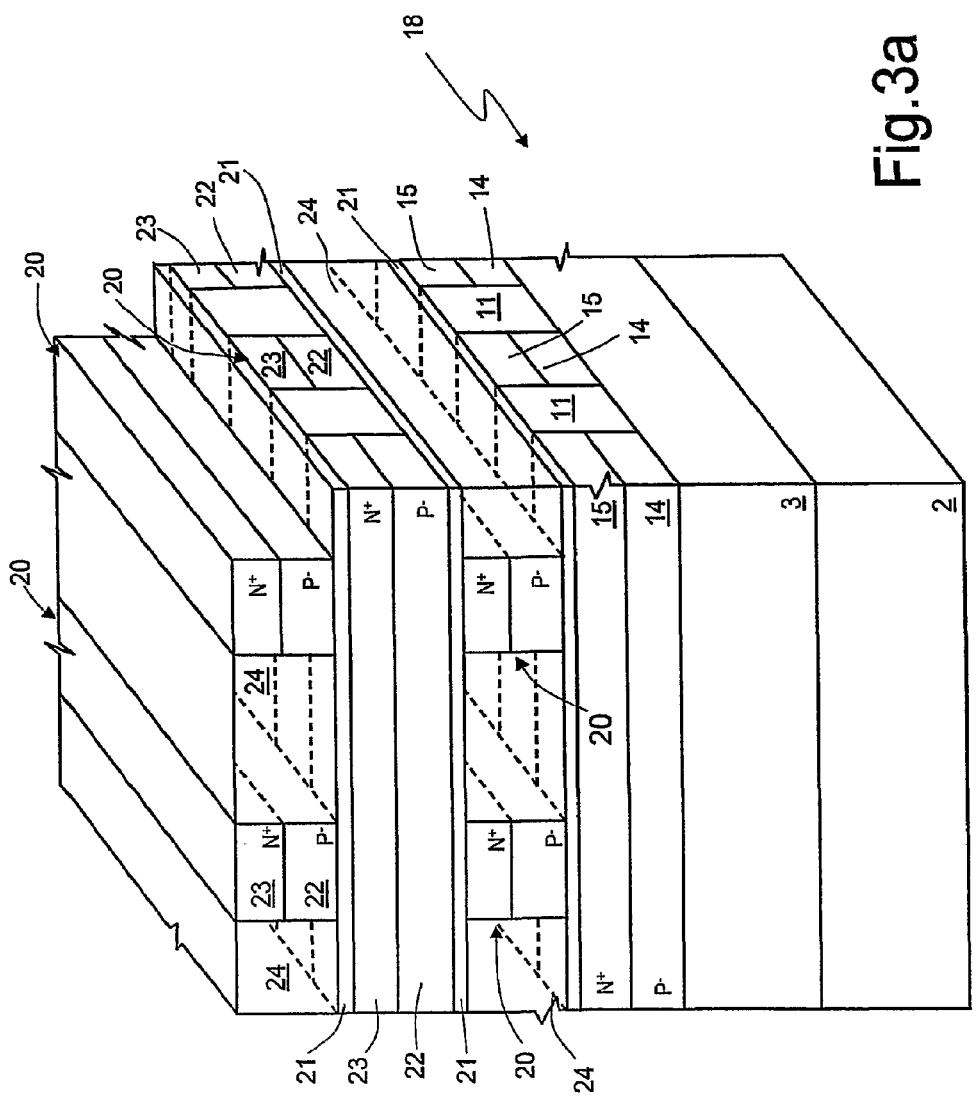
FIG. 3a shows a variation of the three-dimensional multitransistor structure of FIG. 3.

In the structure of FIG. 3, except for the bottom level, which has exactly the same structure as FIG. 2 and for which the same reference numbers are consequently used, each level comprises a plurality of strips 20 separated from one another by insulation regions 24 shown only in the left-hand part of FIG. 3, for clarity of illustration. Each strip 20 comprises a gate oxide layer 21, a bulk line 22 and a conduction line 23, the lines 22, 23 being preferably equal to the bulk line 14 and conduction line 15. Alternatively, the gate oxide layer 21 can extend over all the surface of the underlying level and be continuous throughout the array, as may be seen in FIG. 3a.

The strips 20 of each level extend in a perpendicular direction to the strips 10, 20 of an underlying or overlying level. In this way, each transistor is formed by just one strip 10 or 20 of a given level (this line forming the conduction region 5 of FIG. 1a) and by just one strip 20 of the immediately overlying level (this line forming the gate region 7 of FIG. 1a). In addition, each strip 20 operates alternatively as conduction region 5 of a transistor of a given level or as gate region 7 of a transistor of an underlying level.

FIG. 4a shows the structure of a memory cell 38 based upon the transistor structure of FIG. 1a, so that equal parts are designated by the same reference numbers.

In detail, the memory cell 38 comprises: a silicon substrate 2; a thick oxide layer 3; a bulk region 4; a conduction region 5; a gate oxide region 32; a floating gate region 33; an interpoly oxide region 34 and a control gate region 35. The gate oxide region 32, the floating gate region 33, and the interpoly oxide region 34 form, in a per se known manner, an insulated gate region 31. The floating gate region 33 and control gate region 35 are both of polycrystalline silicon.

Analogously to FIG. 1a, the conduction region 5 is connected at one end to a drain terminal D and at the other end to a source terminal S, the bulk region 4 is connected to a bulk terminal or connection B (set at Vb), and the control gate region 35 is connected to a gate terminal or connection G (set at Vg).

The equivalent electrical circuit of the memory cell 38 of FIG. 4a is shown in FIG. 4b.

Operation of the memory cell 38 is described hereinafter. When the bulk region 4 is not biased (Vb=0V), the memory cell 38 has two different threshold values $Vth0_v$ and $Vth0_p$, where $Vth0_v < Vth0_p$, according to whether the memory cell is virgin (erased) or programmed.

In addition, analogously to the transistor 1 of FIG. 1a, the threshold voltage of each memory cell 38 can be altered by biasing the respective bulk layer 4 via a bulk voltage Vb having a negative value. In this condition, in fact, on account of the body effect, the memory cell 38 has a virgin threshold voltage Vthv for the virgin memory cell and a programmed threshold voltage Vthp for the programmed memory cell, expressed by $$Vth_v = Vth0_v + f(Vb),$$

$$Vth_p = Vth0_p + f(Vb),$$

where f(Vb) is a (known) function of the bulk voltage Vb.

In particular, for a virgin (erased) memory cell, if a bulk voltage Vb such that $f(Vb) < |Vth_{v0}|$ is applied, the threshold voltage $Vth_v$ is still negative and, in the absence of gate voltage (Vg=0V), the cell is slightly in conduction.

Instead, if $f(Vb) \geq |Vth0_v|$, $Vth_v$ is positive, and the cell is off if $Vg < Vth_v$ and is on if $Vg \geq Vth_v$.

Application of a body voltage Vb causes a similar shift of the programmed threshold voltage $Vth_p$ so that, if the bulk region 4 is biased at a negative voltage and an intermediate gate voltage Vg is applied between $Vth_v$ and $Vth_p$, it is possible to read the memory cell 38 as in two-level memory cells.

Programming of the memory cell 38 is obtained by the Fowler-Nordheim tunnelling effect, by applying to the control gate region 35 a high voltage, for example 18 V.

Erasing of the memory cell 38 occurs by reversing the polarity with respect to the programming voltage, by applying a high voltage, for example 18-20 V, to the bulk regions 4 and to the conduction region 5 (electrically connected to each other).

Figure 5:
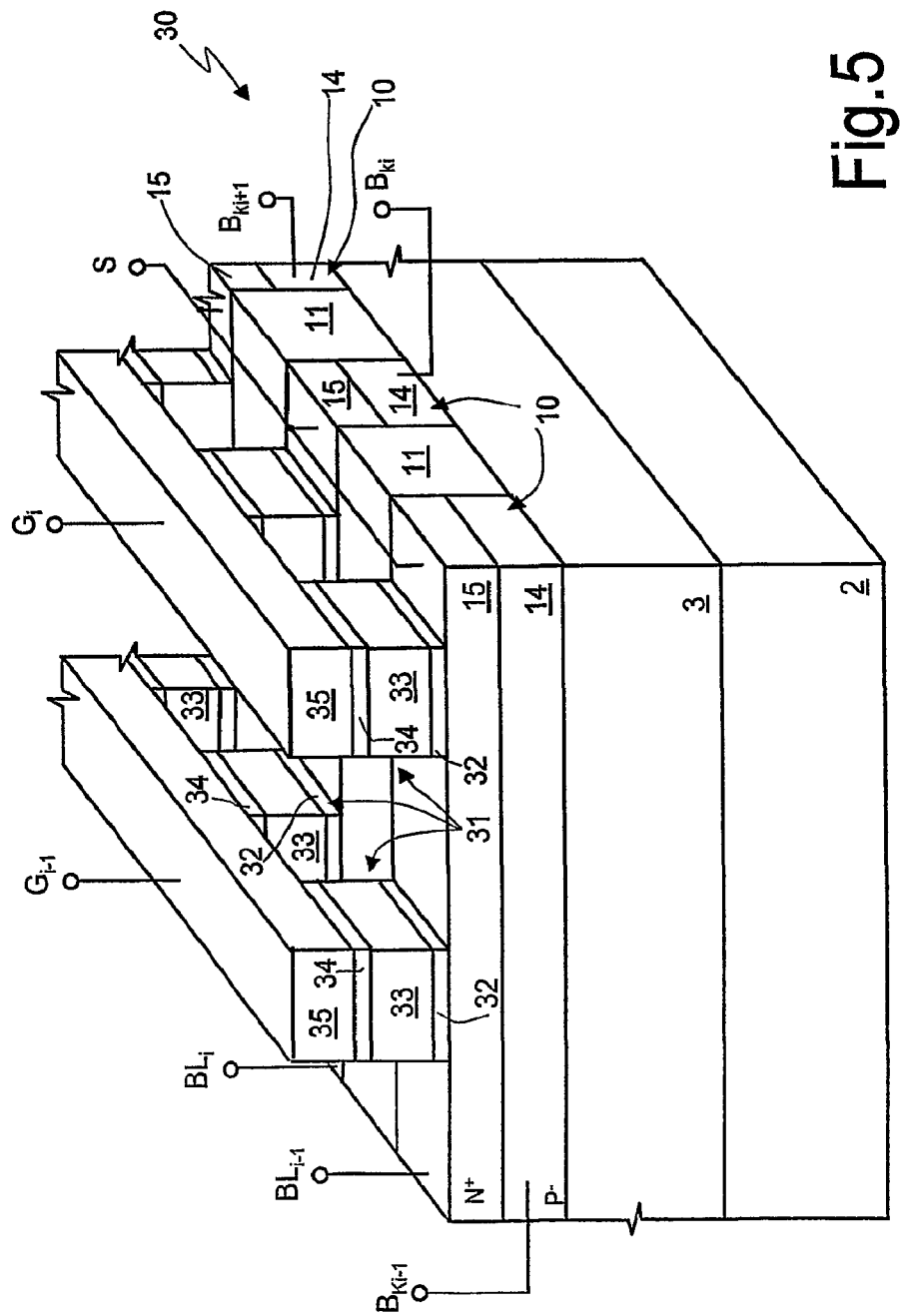

FIG. 5 shows a planar memory array 30 formed by a plurality of memory cells 38 of FIG. 4a.

In detail, the planar memory array 30 comprises a silicon substrate 2, a thick oxide layer 3 and a plurality of strips 10, insulated from one another by a plurality of insulation regions 11. Each strip 10 comprises a bulk line 14 and a conduction line 15, analogously to FIG. 2. A plurality of insulated gate regions 31, formed also here by the regions 32-34, extend on top of each strip 10. Insulation regions (not shown) extend between the insulated gate regions 31. Wordlines 36, of polycrystalline silicon and forming the control gate regions 35 of FIG. 4a, extend on top of the insulated gate regions 31. The wordlines 36 are also separated by insulation regions (not shown). Also in this case, instead of having separate gate oxide regions 32, it is possible to have just one continuous gate oxide layer extending over all the surface of the array.

The wordlines 36 extend in a direction perpendicular to the strips 10 and are each connected to a gate connection $G_{i-1}$, $G_i$, ..., biased, in use, to a gate voltage $Vg_{i-1}$, $Vg_i$, .... The strips 10 are connected, at a first end, to a bitline connection $BL_{i-1}$, $BL_i$, ..., and, at an opposite end, to a common source connection S (for example connected to ground during reading). The bulk lines 14 are connected to respective bulk connections $B_{i-1}$, $B_i$, ....

In practice, each insulated gate region 31 forms, with the portion of the overlying strip 10 and the portion of the overlying wordline 36, a memory cell 38, and the memory cells 38 are aligned along the strips 10 and along the wordlines. In addition, each memory cell 38 is formed only by a portion of a single strip 10, by the portion of the overlying wordline 36 and by the interposed insulated gate region 31.

Operation of the planar memory array 30 is based upon the considerations made for the memory cells 38.

Figure 6:
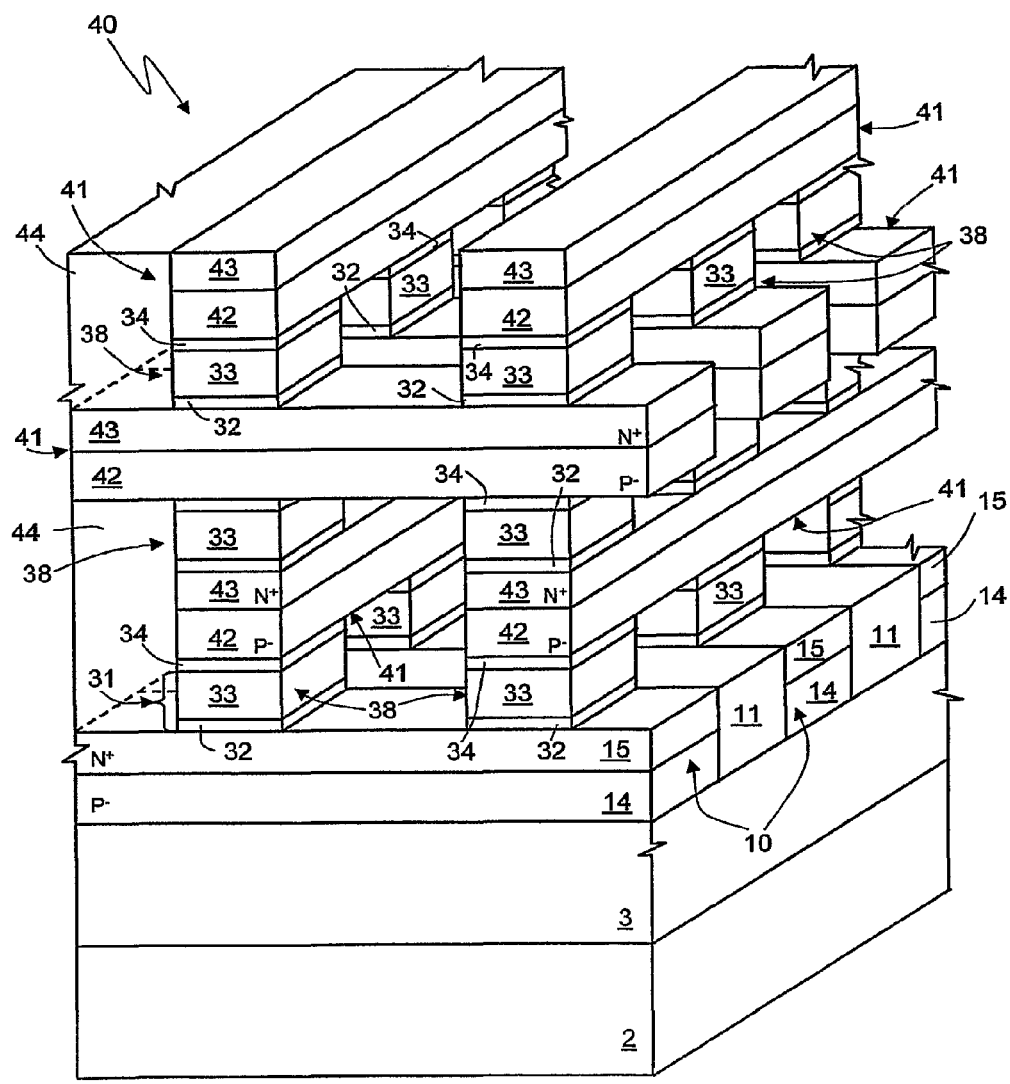
FIG. 6 is a perspective view of a three-dimensional memory array based upon the planar structure of FIG. 5.

FIG. 6 shows a three-dimensional memory array 40 based upon the planar memory array 30 of FIG. 5.

In detail, in the structure of FIG. 6, except for the bottom level, which has exactly the same structure shown in FIG. 5 and for which the same reference numbers are consequently used, each level comprises a plurality of strips 41 and a plurality of insulated gate regions 31. Each strip 41 comprises a bulk region 42 and a conduction region 43 similar to the regions 14, 15. The insulated gate regions 31 are formed also here by the regions 32-34. Preferably, the interpoly oxide regions 34 have an electrical thickness (equal to the thickness divided by the relative dielectric constant) that is greater than that of the gate oxide regions 32 so as to render the memory cells 38 asymmetrical.

The strips 41 of each level extend in a perpendicular direction to the strips 10, 41 of an underlying or an overlying level, and the insulated gate regions 31 are arranged at the intersections between strips 41 of successive levels. The adjacent strips 41 and the insulated gate regions 31 are separated by insulation regions 44 (shown only in part and similar to the regions 11). In this way, each memory cell 38 is formed by just one strip 10 or 41 of a given level (forming a conduction region, including a first conduction region 5a and a second conduction region 5b and a channel region 5c) and by just one strip 41 of the immediately overlying level (forming a control gate region), as well as by the interposed insulated gate region 31. In addition, each strip 41 operates alternatively as conduction region of the memory cells 38 of a given level (aligned in a first direction) or as control gate region of the memory cell of an underlying level (aligned in a second direction, perpendicular thereto).

Operation of each level of the three-dimensional memory array 40 of FIG. 6 is similar to what indicated for the planar memory array 30. Of course, in this case, selectors for correct selection and biasing of each strip of the various levels are provided at least at one end of each strip 41. In addition, the difference in thickness between the regions 32 and 34 ensures that programming and erasing occur only through the gate oxide region 32 and thus ensures programming or erasing of the cells of the desired level.

FIG. 7a shows the structure of a different memory cell 48 based upon the transistor structure of FIG. 1a, so that equal parts have been designated by the same reference numbers.

In detail, the memory cell 48 comprises a silicon substrate 2; a thick oxide layer 3; a bulk line 14; a conduction line 15; an ONO region 51 and a control gate region 55 of polycrystalline silicon. The ONO region 51 is formed by a gate oxide region 52; a charge trapping region 53 of silicon nitride; and an interpoly oxide region 54, preferably having a greater thickness than the gate oxide region 52.

For example, the bulk line 14 has a thickness of 50 nm, the conduction line 15 has a thickness of 30 nm, the gate oxide region 52 has a thickness of 7 nm, the charge trapping region 53 has a thickness of 8 nm, the interpoly oxide region 54 has a thickness of 13 nm, and the control gate region 55 has a thickness of 50 nm.

Analogously to FIG. 1a, the conduction line 15 is connected to a drain terminal D and to a source terminal S, the bulk line 14 is connected to a bulk terminal or connection B (set at Vb), and the control gate region 55 is connected to a gate terminal or connection G (set at Vg). In practice, in the memory cell 48 of FIG. 7a, the insulated gate region 41 of FIG. 4a is replaced by the ONO region 51. Consequently, the charge trapping layer is of dielectric material, and the electrical charges trapped in the programming step are not free to move in the charge trapping region 53. As regards the rest, the structure and operation of the memory cell 48 are the same of the memory 38.

The equivalent electrical circuit of the memory cell 48 is shown in FIG. 7b.

Operation of the memory cells 48 is similar to described above for the memory cells 38 with reference to FIG. 4a.

Figure 8:
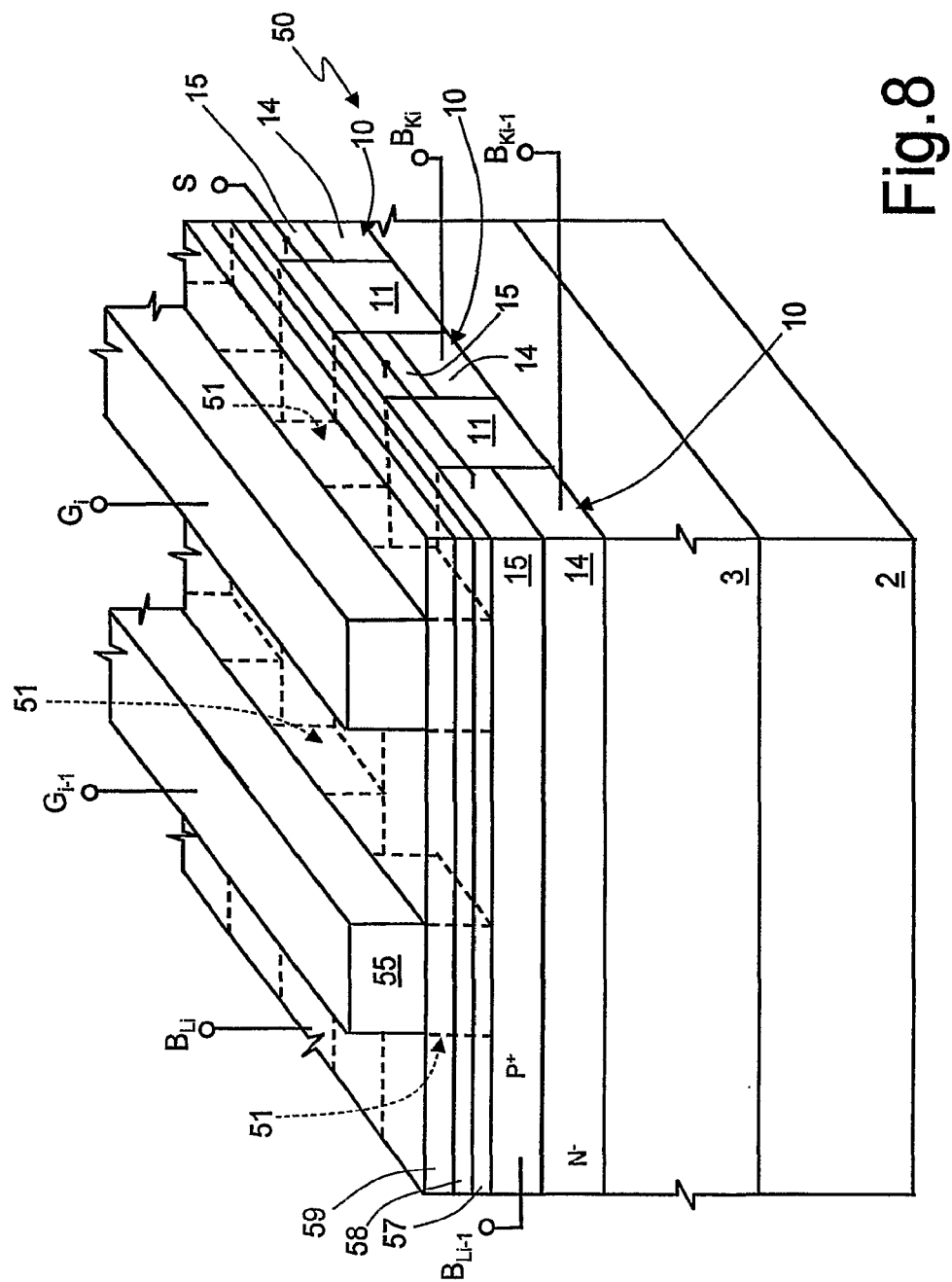
FIG. 8 shows a perspective view of a planar memory array formed by memory cells according to FIG. 7*a*.

FIG. 8 shows a planar memory array 50 formed by a plurality of memory cells 48 of FIG. 7a.

In detail, the planar memory array 50 comprises a silicon substrate 2, a thick oxide layer 3 and a plurality of strips 10. An ONO stack, formed by a gate oxide layer 57, a charge trapping layer 58 of silicon nitride and an interpoly oxide layer 59 extend on top of each strip 10. Wordlines 56 of polycrystalline silicon extend on top of the ONO stack and form the control gate regions 55 of FIG. 7a. In practice, the wordlines 56 form the control gate regions, and the ONO stack forms, at the intersections between the wordlines 56 and the strips 10, the insulated gate regions 51 of FIG. 7a, represented partly with a dashed line in FIG. 7a for a better understanding. In fact, since the charge trapping layer 58 is of dielectric material and thus does not enable mobility of the trapped charges, it can be defined by a continuous layer and does not call for purposely provided masking and etching steps for its definition, thus enabling a saving in terms of manufacture costs and a better electrical behavior, in so far as steps that may cause damage are eliminated.

The wordlines 56 extend in a perpendicular direction to the strips 10 and are connected each to a gate connection $G_{i-1}$, $G_i$, . . . , biased, in use, at a gate voltage $Vg_{i-1}$, $Vg_i$, . . . . Analogously to FIG. 5, the strips 10 are connected, at a first end, to a bitline connection $BL_{i-1}$, $BL_1$, . . . , and, at an opposite end, to a common source connection S. The bulk lines 4 are connected to respective bulk connections $Bk_{i-1}$, $BK_i$, . . . .

In practice, the portions of the ONO layer arranged at the intersection of the strips 10 and of the wordlines 56 form, with the facing portions of these strips 10 and of these lines 56, memory cells 48.

As an alternative, instead of having a non-defined ONO stack, extending throughout the area of the memory array 50, it is possible to have a plurality of ONO lines self-aligned to the wordlines 56 and defined using the same mask.

In addition, instead of being of silicon nitride, the charge trapping layers 58 can be of a very thin layer of polysilicon deposited in such a way that the polysilicon grains do not merge with one another. Each micrograin or nanograin would thus be spatially separated from the adjacent ones in the same level and thus would substantially be insulated between the gate oxide layer 57 and the interpoly oxide layer 59 and would act as local floating gate region. Reversal of the electric field could effectively inject/extract electrons into/from the micrograins/nanograins. All of the micrograins/nanograins outside the area of intersection of the strips 10 and wordlines 56 would substantially be inactive, albeit conductive, since they are laterally spaced away from the others.

Operation of the planar memory array 50 of FIG. 8 is similar to that of the memory array 40 of FIG. 4.

This solution has the advantage of not being subject to problems of capacitive coupling between the memory cells 48 even in the case of small overall dimensions (for example, in case of channel lengths of 50 nm and a distance between the strips 10 and wordlines 56 also of approximately 50 nm, phenomenon referred to as "fringe capacitance").

Figure 9:
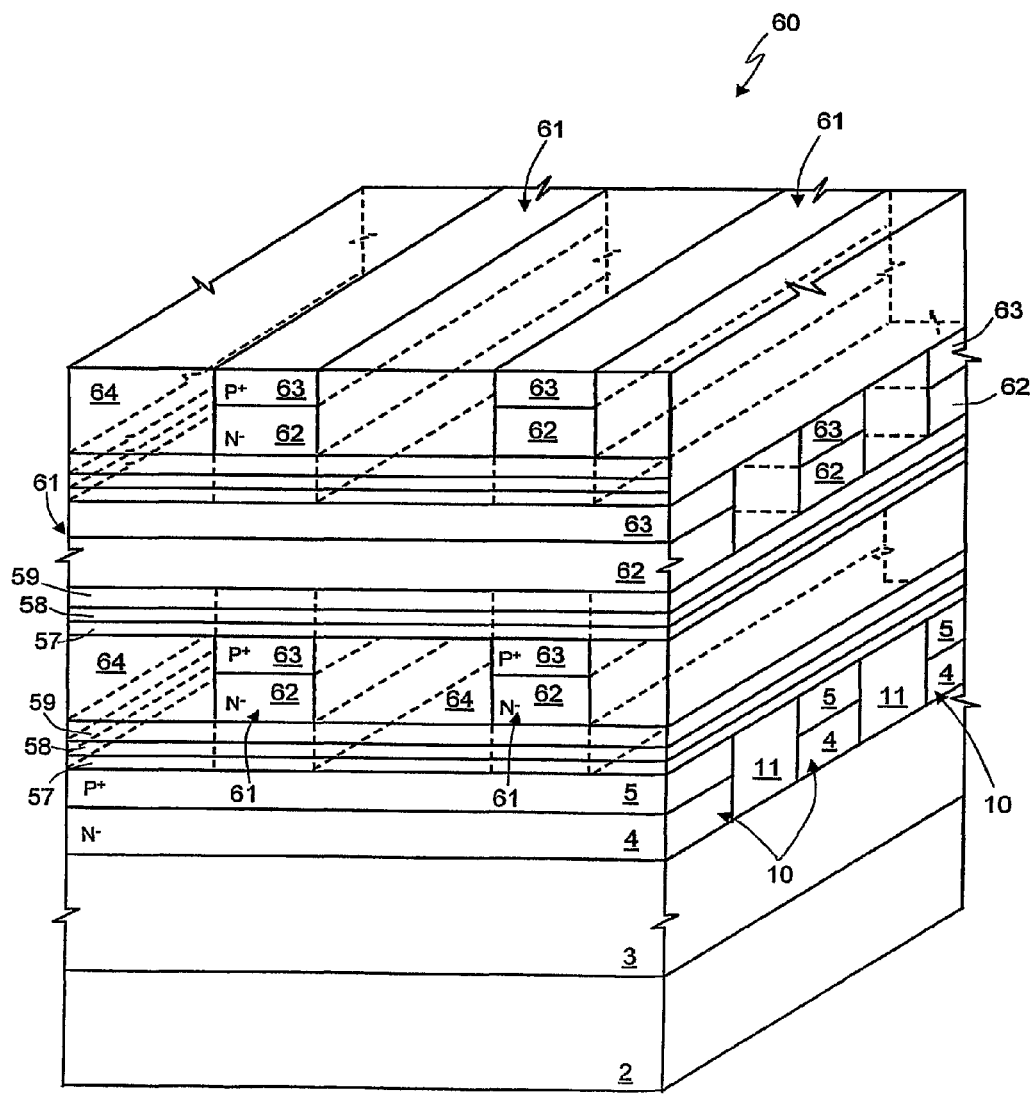
FIG. 9 shows a perspective view of a three-dimensional memory array based upon the planar structure of FIG. 8.

FIG. 9 shows a three-dimensional memory array 60 based upon the planar memory array 50 of FIG. 8.

In detail, in the structure of FIG. 9, except for the bottom level, which has exactly the same structure as that of FIG. 8, each level comprises an ONO stack 57-59 and a plurality of strips 61 separated by insulation regions 64. Each strip 61 comprises a bulk line 62 and a conduction line 63 similar to the lines 14, 15.

Analogously to FIG. 6, the strips 61 of each level extend in a perpendicular direction to the strips 10, 61 of an overlying or underlying level. In this way, each memory cell is made up of just one strip 10 or 61 of a given level (forming a conduction region) and just one strip 61 of the immediately overlying level (forming a control gate region), as well as the portion of the ONO stack arranged on the intersection between said two strips 61. Consequently, analogously to FIG. 6, each strip 61 acts alternatively as conduction region of a memory cell 48 of a given level and as gate region of a memory cell 48 of an underlying level.

Also in this case, as in the planar memory array 50 of FIG. 8, the charge trapping layers 58 can be of a very thin deposited polysilicon layer, and/or the stack 57-59 can be defined so as to form a plurality of strips congruent with the strips 61.

The advantages of the described devices are evident from the above description. In particular, the extreme flexibility of the basic structure is emphasized. In fact, the formation of the channel, source and drain regions in one and the same conduction region 5 and the presence of two control regions, formed by the gate region 7 and by the bulk region 4, enable an extremely compact structure to be obtained. In this way, each transistor 1 or memory cell 18, 31, 38 of an array is always made up only by two strips that intersect with one another and thus occupy a small lateral space, not bound by photolithographic limits. The entire array can thus present small overall dimensions both in the two-dimensional solution and in the three-dimensional one.

Furthermore, the fact that the regions 5a, 5b adjacent to the channel region 5c do not undergo reversal of polarity even when the channel is pinched off, enables their connection as desired with similar portions of other devices of the same type or of different types. Consequently, the basic structure can be combined in numerous ways and enables any type of circuit or overall structure to be made.

The basic structure can moreover be modified easily so as to form transistors or memory cells, individual devices or devices connected to form arrays, and these in turn can be of a two-dimensional type or else of a three-dimensional type, as described in detail above.

The possibility of obtaining pinch-off of the channel portion 5c by applying pinch-off voltages to the bulk region 4 or to the gate region 7 or in any case modulating variously in a combined way the voltages applied to the control regions 4, 7 bestows an extreme functional flexibility upon the device.

In addition, the basic structure of the memory cell can be modified simply using different technologies, so as to provide the gate region of an ONO type, using nitride, using a poly-silicon nanolayer, using a phase change material, or any other material that exploits any physical principle of storage of information.

Finally, use of materials that have been known and tested for years guarantees controllability and reproducibility of the devices.

Finally, it is clear that numerous modifications and variations can be made to the devices described and illustrated herein, all falling within the scope of the invention, as defined in the annexed claims.

In particular, it is highlighted that the devices (transistors and cells) can be connected in numerous ways, implementing different types of architectures. In particular, in the case of memory arrays, both AND and OR architectures may be obtained. The bulk regions 4; 14; 22; 42; 62 and conduction regions 5; 15; 43; 63 can be arranged differently, for example arranged laterally alongside one another.

What is claimed is:

1. A method comprising:
   forming a conductive strip of semiconductor material, the conductive strip including a conduction line of a first conductivity type and a control line of a second opposing conductivity type, the conduction line being elevationally over and in electrical contact with the control line, and the conduction line including a channel portion, and a first conduction portion and a second conduction portion arranged on opposite sides of the channel portion;
   forming a control gate region of semiconductor material, facing the channel portion of the conductive strip; and
   forming an insulation region arranged between the conductive strip and the control gate region.

2. The device of claim 1, wherein the control gate region comprises a first control gate region, and wherein the method further comprises forming a second control gate region, and wherein said forming the conductive strip comprises forming the conductive strip over the first and the second control gate regions.

3. The method of claim 1, wherein said forming the conductive strip comprises forming said conduction line and control line contiguously to one another.

4. The method of claim 1, wherein said forming the conductive strip comprises forming said conduction line and control line superimposed on one another.

5. The method of claim 1, further comprising forming an insulated gate region incorporating said insulation region and arranged between said control gate region and said channel portion.

6. The method of claim 5, wherein said insulated gate region comprises a floating gate region of semiconductor material.

7. The method of claim 1, wherein the forming of the conductive strip comprises forming a first conductive strip, and wherein the method further comprises forming a second conductive strip extending transversely to said first conductive strip.

8. A method of forming a semiconductor construction, comprising:
   forming a first conductive strip of semiconductor material, the first conductive strip including a conduction line of a first conductivity type and a control line of a second opposing conductivity type, the conduction line and control line being adjacent and in electrical contact with each other, and the conduction line including a channel portion, and a first conduction portion and a second conduction portion arranged on opposite sides of the channel portion;

forming a control gate region of semiconductor material over the channel portion of the first conductive strip;

forming an insulation region arranged between the first conductive strip and the control gate region; and forming a second conductive strip extending transversely to said first conductive strip.

9. The method of claim 8 further comprising forming a bulk region, the method comprising:

depositing an oxide layer over a substrate; and depositing a first polycrystalline layer over the oxide layer, wherein the bulk region underlies the first and second conductive strips.

10. The method of claim 9 further comprising connecting the bulk region to a bulk terminal.

11. A method of forming a semiconductor construction comprising a plurality of transistors, the method comprising:

forming a stack of materials including an oxide layer over a substrate, a doped bulk region over the oxide layer, and an opposingly doped conduction region over the bulk region, the conduction region comprising channel region, a first conductive portion on a first side of the channel region and a second conductive portion on an opposing second side of the channel region, wherein the bulk region and conduction region together form a first conductive strip; and forming a gate oxide region over the conduction region and a gate region over the gate oxide region, the gate region being comprised by a second conductive strip that is orthogonal relative to the first conductive strip.

12. The method of claim 11 further comprising:

connecting the first conductive portion with a drain terminal on a first side of the gate region; and connecting the second conductive portion with a source terminal on a second side of the gate region.

* * * * *